United States Patent
Hu et al.

(10) Patent No.: US 10,879,670 B2
(45) Date of Patent: Dec. 29, 2020

(54) CONTINUOUS-WAVE PUMPED POLYMER LASER AND PREPARATION METHOD THEREOF

(71) Applicants: ZHANGJIAGANG INSTITUTE OF INDUSTRIAL TECHNOLOGIES SOOCHOW UNIVERSITY, Jiangsu (CN); SOOCHOW UNIVERSITY, Jiangsu (CN)

(72) Inventors: Zhijun Hu, Suzhou (CN); Xiaohui Li, Suzhou (CN); Chinhua Wang, Suzhou (CN); Yuyan Weng, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 0 days.

(21) Appl. No.: 16/611,086

(22) PCT Filed: Nov. 6, 2018

(86) PCT No.: PCT/CN2018/114068
§ 371 (c)(1),
(2) Date: Nov. 5, 2019

(87) PCT Pub. No.: WO2019/096025
PCT Pub. Date: May 23, 2019

(65) Prior Publication Data
US 2020/0153200 A1 May 14, 2020

(30) Foreign Application Priority Data
Nov. 15, 2017 (CN) .......................... 2017 1 1127708

(51) Int. Cl.
*H01S 5/00* (2006.01)
*H01S 5/12* (2006.01)
(Continued)

(52) U.S. Cl.
CPC ............ *H01S 5/1221* (2013.01); *H01S 5/041* (2013.01); *H01S 5/1228* (2013.01); *H01S 5/36* (2013.01)

(58) Field of Classification Search
CPC .......... H01S 5/041; H01S 5/1221; H01S 5/36; H01S 5/1228
See application file for complete search history.

(56) References Cited

U.S. PATENT DOCUMENTS 6,160,828 A * 12/2000 Kozlov .................... H01S 5/36
372/39
6,577,657 B1 * 6/2003 Elschner ............... H01S 5/0206
372/39
(Continued)

FOREIGN PATENT DOCUMENTS

CN  101001001 A  7/2007
CN  102651534 A  8/2012
(Continued)

OTHER PUBLICATIONS

"Two-dimensional distributed feedback lasers with thermally-nanoimprinted perylenediimide-containing film", Eva M. Calzado et al., Optical Materials Express, vol. 7, No. 4, Apr. 1, 2017.
(Continued)

*Primary Examiner* — Kinam Park
(74) *Attorney, Agent, or Firm* — SZDC Law PC.

(57) ABSTRACT

The invention provides a continuous-wave pumped polymer laser and preparation method thereof, comprising: coating an organic polymer solution onto a substrate to form an polymer film, and applying a template having a distributed feedback structure to the polymer film, or coating an organic polymer solution onto a substrate having a distributed feedback structure to form an polymer film, and applying a plate to the polymer film; heating the substrate to reach above the phase transition temperature of the organic polymer, and
(Continued)

applying a pressure to the template or plate for 1-100 min; and cooling the substrate to reach below the phase transition temperature of the organic polymer, and removing the template or plate from the organic polymer. The method of the invention is simple, the organic polymer molecular chain and supramolecular structure are oriented to have long range order, and the obtained laser can use continuous-wave pumping.

10 Claims, 9 Drawing Sheets

(51) Int. Cl.
  *H01S 5/04* (2006.01)
  *H01S 5/36* (2006.01)

(56) References Cited

U.S. PATENT DOCUMENTS 7,804,873 B2 * 9/2010 Liu .................... H01S 5/04253
  372/50.11
2004/0101008 A1 * 5/2004 Kurtz .................... H01S 5/36
  372/39
2011/0108899 A1 * 5/2011 Jonas .................... G11C 11/22
  257/295
2017/0149210 A1 * 5/2017 Zhai .................... H01S 5/36

FOREIGN PATENT DOCUMENTS

| | | |
|---|---|---|
| CN | 102910579 A | 2/2013 |
| CN | 104882780 A | 9/2015 |
| CN | 105356295 A | 2/2016 |
| CN | 107681463 A | 2/2018 |
| JP | 2000068601 A | 3/2000 |
| JP | 2004071678 A | 3/2004 |

OTHER PUBLICATIONS

"Optical amplification in organic dye-doped polymeric channel waveguide under CW optical pumping", Kenichi Yamashita et al., JJAP Express Letter, vol. 46, No. 28, 2007.

* cited by examiner

CONTINUOUS-WAVE PUMPED POLYMER LASER AND PREPARATION METHOD THEREOF

This application is the National Stage Application of PCT/CN2018/114068, filed on Nov. 6, 2018, which claims priority to Chinese Patent Application No.: 201711127708.3, filed Nov. 15, 2017, which is incorporated by reference for all purposes as if fully set forth herein.

FIELD OF THE INVENTION

The present invention relates to the field of light-emitting device, and more particularly to a continuous-wave pumped polymer laser and preparation method thereof.

DESCRIPTION OF THE RELATED ART

Since the first demonstration of laser oscillation in organic materials in 1960s, solutionprocessable solidstate lasers have attracted great interest. Currently reported solution processable optical gain media mainly include organic dyes, organic semiconductors, inorganic nanoparticles, organic-inorganic hybrid materials, and the like. Among them, organic polymers are especially attractive because they show several unique features such as large cross sections, flexibility in molecular design, and compatibility with soft polymer substrates, and thus promises potential applications in spectrometers, data communication, chemical sensors, and illumination. In 1996, the research team of R. H. Friend from the University of Cambridge and the research team of A. J. Heeger from the University of California, initially reported a polymer laser based on poly phenylene vinylene (PPV) material respectively. Since then, organic polymer lasers have been developed rapidly, for the purpose of miniaturization and weight reduction of organic polymer lasers.

Although a lot of research has been done on organic polymer lasers, the pump light source of organic polymer lasers is still limited to large-volume, expensive femtosecond or nanosecond pulsed lasers, thus failing to realize the miniaturization and weight reduction. The reason is that there is a serious optical loss in the organic polymer film. Studies have shown that optical loss mainly results from the light absorption by polarons or triplet excitons in the polymer optical gain media. Although most organic semiconductors can produce singlet excitons having a four-level energy structure upon photoexcitation, the lifetime of singlet excitons is typically of the order of picoseconds. The lifetime of polarons and triplet excitons ranges from nanoseconds to milliseconds. The large difference in lifetimes between the singlet excitons and the polarons and triplet excitons results in the presence of only a small number of singlet excitons in the polymer optical gain media. The presence of polarons or triplet excitons inhibits the recombination of electron-hole pairs and results in fluorescence quenching. Therefore, most organic polymer lasers are pumped with femtosecond or nanosecond lasers with a pulse width that is less than the lifetime of the polarons or triplet excitons. The formation of polarons is related to the distance between polymer molecules. In recent years, quasi-continuous-wave pumped organic polymer lasers are successfully prepared in such a way that, the distance between the polymer molecular chains is increased by increasing the volume of the side chain by means of molecular design, or the polymer molecular chains are wrapped in other mesoporous materials to suppress the formation of polarons. In order to suppress the formation of triplet excitons, a method of doping a triplet-state quencher in an organic polymer optical gain medium has been developed, and a quasi-continuous-wave pumped organic polymer laser has also been successfully achieved. Although the above technique can effectively suppress the formation of polarons or triplet excitons, to successfully prepare a quasi-continuous-wave pumped organic polymer laser, it is still impossible to achieve a continuous-wave pumped laser. Continuous-wave pumped organic polymer lasers have great advantages in the fields of spectrometers, optical communication, chemical sensors, and illumination, etc. They are more suitable for the miniaturization and weight reduction of devices, and have the advantages of reduced energy consumption, and inexpensive pump light source.

Actually, continuous-wave operation of solid state lasers has been widely achieved in inorganic semiconductors. This is because inorganic semiconductors have rigid atomic lattice with long range order in which excitons can wander relatively unimpededly. Polymers are, however, intrinsically disordered because polymeric chains have large entropy and weak intermolecular interactions which hinder the formation of extended chains and single crystalline structures. In a disordered polymer film, excitons are likely to be trapped at structural defects during transport, thus reducing the number and lifetime of singlet excitons. Structural defects may include chemical defects and grain boundaries of the molecular chain conformation.

In addition, the adjustment of the laser performance of organic polymer lasers is still considered a significant challenge currently. The adjustment of laser performance mainly includes the adjustment of the optical pumping threshold and polarization performance. In a method for adjusting the optical pumping threshold, molecules with higher degree of conjugation and higher crystallinity are designed and synthesized by changing the molecular structure of the polymer, to achieve the reduction of optical pumping threshold. In the design of the resonator structure, the adjustment of optical pumping threshold of a laser is achieved by means of a distributed feedback (DFB) structure in which first-order and second-order resonators coexist. In the adjustment of the polarization performance of lasers, the research mainly focuses on adjusting the polarization performance of lasers by the vapor deposition of a transparent metal layer on the upper and lower layers of a polymer material to achieve electric field coupling. These adjustment methods are complicated, have limited scope of application, suffer from the drawbacks of scattering on the interface between the metal and polymer, and cannot achieve the continuous adjustment of laser performance. Continuous-wave pumped organic polymer lasers with adjustable laser performance have great advantages in the fields of spectrometers, optical communication, chemical sensors, and illumination, etc. They are more suitable for the miniaturization and weight reduction of devices, and have the advantages of reduced energy consumption, and inexpensive pump light source.

The distributed feedback (DFB) structure is one of the common design methods for preparing organic polymer lasers. The fundamental principle is to realize the exciton oscillation and optical coupling by Bragg grating. The advantage is that the optical gain length is large and the optical pumping threshold is low. Methods for constructing a DFB structure in an organic polymer film include direct photolithography (forming a DFB structure directly in a crosslinkable organic polymer film by lithographic techniques) and coating (coating an organic polymer on a substrate with a Bragg grating by a coating technique). In the DFB Bragg grating prepared by these methods, the organic polymer remains substantially in a disordered state. In short, the existing organic polymer lasers still cannot achieve the continuous-wave pumping.

SUMMARY OF THE INVENTION

To solve the above technical problems, an object of the present invention is to provide a continuous-wave pumped polymer laser and preparation method thereof. The method of the present invention is simple, the organic polymer molecular chain and supramolecular structure are oriented to have long-range order, the obtained laser can use continuous-wave pumping, and the optical pumping threshold and degree of polarization of the laser can be adjusted according to actual needs.

The present invention provides a method for preparing a continuous-wave pumped polymer laser, comprising the following steps:

(1) coating an organic solution of an organic polymer onto a planar transparent substrate, to form an organic polymer film, and applying a template having a distributed feedback structure to the surface of the organic polymer film, or coating an organic solution of an organic polymer onto a transparent substrate having a distributed feedback structure, to form an organic polymer film, and applying a plate to the surface of the polymer film, wherein the organic polymer is a photoluminescence polymer;

(2) heating the substrate, to allow the temperature of the substrate to be above the phase transition temperature of the organic polymer, and then applying a pressure to the surface of the template or plate for 1-100 min; and (3) slowly cooling the substrate to allow the temperature of the substrate to be below the phase transition temperature of the organic polymer, and removing the template or plate from the surface of the organic polymer, to obtain the continuous-wave pumped polymer laser.

Preferably, in the step (1), the substrate is made of silicon, silica, alumina, quartz, glass, polyamides, polyesters, polyvinylidene fluoride, polytetrafluoroethylene, or polysiloxane.

Preferably, in the step (1), the organic polymer is a polyfluorene homopolymer having an emission wavelength of 400-480 nm, wherein the polyfluorene homopolymer is poly(9,9-dioctylfluorene) and/or poly(9,9-diethylhexylfluorene).

Preferably, in the step (1), the organic polymer is a polyfluorene copolymer having an emission wavelength of 480-580 nm, wherein the polyfluorene copolymer is selected from the group consisting of poly(9,9-dioctylfluorene-alt-6,6'-pyridine), poly(9,9-dioctylfluorene-alt-6,6'-2,2'-bipyridine), poly(9,9-dioctylfluorene-alt-6,6'-2,2':6'2''-terpyridine), and poly(9,9-dioctyl-alt-1-4-benzo(2,1'3-thiadiazole).

Preferably, in the step (1), the organic polymer is a poly(phenylenevinylene) polymer having an emission wavelength of 580-700 nm, wherein the poly(phenylenevinylene) polymer is selected from the group consisting of poly[2-methoxy-5-(2-ethylhexyloxy)1,4-phenylenevinylene], poly[2-methoxy-5-(3,7-dimethyloctyloxy)1,4-phenylenevinylene], and poly[2-methoxy-5-(3,7-dimethyloctyloxy)-1,4-phenylacetylene].

Preferably, in the step (1), the period of the distributed feedback structure matches with the emission wavelength of the organic polymer to satisfy the Bragg condition, that is $2n_{eff}\wedge=2\lambda_{Bragg}$, where $n_{eff}$ is the refractive index of the organic polymer, $\wedge$ is the period of the distributed feedback structure, and $\lambda_{Bragg}$ is the emission wavelength of the organic polymer. After the continuous-wave pumped polymer laser is prepared, the organic polymer used in step (1) forms a film, thus, $\lambda_{Bragg}$ is the emission wavelength of the film.

The lateral dimension of the organic polymer in the DFB structure is greater than 1 nanometer, and less than $\wedge$, and the thickness is greater than 10 nanometer.

Preferably, in the step (1), when the organic polymer is poly(9,9-dioctyl-alt-1-4 benzo{2,1'3-thiadiazole}), the period of a template having the distributed feedback structure (DFB) or a transparent substrate having the distributed feedback structure is 300-400 nm. More preferably, the period of the DFB structure is 320 nm.

Preferably, in the step (1), when the organic polymer is poly(9,9-dioctylfluorene), the period of a template having the distributed feedback structure (DFB) or a transparent substrate having the distributed feedback structure is 250-400 nm. More preferably, the period of the DFB structure is 280 nm.

The characteristic dimension of the distributed feedback structure is adjusted without changing the DFB structure, and the orientation order and degree of orientation of the polymer molecular chain and the supramolecular structure in the DFB structure are adjusted by virtue of the confinement effect of the nano space of the DFB structure. Therefore, the number and lifetime of singlet excitons generated by optical pumping, and the external luminescence quantum efficiency are adjusted, and a continuous-wave pumped organic polymer laser with adjustable laser performance is achieved. Thus, continuous-wave pumped organic polymer lasers having different optical pumping thresholds and degrees of polarization are prepared, which are more suitable for the miniaturization and weight reduction of organic polymer lasers.

Preferably, in the step (2) and the step (3), the phase transition temperature is glass transition temperature, crystallization temperature, or order-disorder transition temperature of the liquid crystal.

Preferably, in the step (2), the applied pressure is 1-100 atm. More preferably, the applied pressure is 50-70 atm.

Preferably, in the step (2), the surface of the template or plate having the distributed feedback structure is pressurized for 5-30 min.

Preferably, in the step (4), after removing the template or the plate, the method further comprises the step of coating the surface of the organic polymer with a transparent protective layer, where the protective layer is made of an inorganic material selected from silicon oxide, calcium oxide or the like; or an organic material selected from polysiloxane, polyethylene terephthalate, polyethylene naphthalate, polyamide or polytetrafluoroethylene.

Preferably, in the step (1), the distributed feedback structure is a one-dimensional Bragg grating or a two-dimensional photonic crystal structure.

Preferably, in the step (1), the organic solution contains an organic solvent is selected from the group consisting of toluene, xylene, chlorobenzene, benzene, chloroform, cyclohexane, pentane, hexane and octane.

Preferably, in the step (1), the template or substrate having the distributed feedback structure may be prepared by photolithography such as visible light lithography, ultraviolet lithography, X-ray lithography, electron beam lithography, ion beam lithography, and nanoimprinting, etc, to form a DFB structure in the photoresist, which is then transferred to the surface of the substrate by ion etching. Alternatively, a layer of organic polymer may be coated on the surface of the photoresist to replicate the DFB structure in the photoresist or substrate.

Preferably, in the step (1), the organic solution containing the organic polymer has a concentration of 1.0 to 100 mg/ml.

Preferably, in the step (1), the thickness of the organic polymer film is 1 to 1000 nm.

Preferably, in the step (2), the heating rate is 0.1-1000° C./min.

Preferably, in the step (3), the cooling rate is 0.1-1000° C./min.

Preferably, in the step (3), during the cooling process, the molecular chain of the organic polymer is orientated to have long-range order and the shape is fixed.

Preferably, in the step (4), the continuous-wave pumped polymer laser does not contain an organic solvent.

Preferably, as the lateral size of the organic polymer decreases in the distributed feedback structure, the degree of orientation of the organic polymer molecules increases.

Preferably, as the lateral size of the organic polymer decreases in the distributed feedback structure, the optical pumping threshold of the polymer laser decreases.

Preferably, as the lateral size of the organic polymer decreases in the distributed feedback structure, the degree of polarization of light output from the polymer laser increases. The preparation method and the above principles of the present invention can also be applied to other fields, such as the preparation of solar cells.

In another aspect, the present invention further provides a continuous-wave pumped polymer laser prepared by the method according to the above method, comprising: a transparent substrate and an organic polymer having orientation order on the transparent substrate, wherein the organic polymer is a photoluminescence polymer and has a distributed feedback structure.

Preferably, the continuous-wave pumped polymer laser further includes a protective layer on the surface of the organic polymer, where the protective layer is made of an inorganic material which is silicon oxide, calcium oxide or the like; or an organic material selected from polysiloxane, polyethylene terephthalate, polyethylene naphthalate, polyamide, polytetrafluoroethylene or the like.

Preferably, the orientation order of the organic polymer may mean that the molecular chain is parallel to, perpendicular to, or oblique to the direction of Bragg grating.

In order to achieve the continuous-wave pumped organic optical laser, the technical solution adopted in the present invention comprises a method for preparing an organic polymer DFB structure. The orientation order of the polymer molecular chain and the supramolecular structure are adjusted in the process of fabricating the DFB structure. By means of the above solution, the present invention has the following advantages.

1. In the process of processing the organic polymer DFB structure, the orientation order of the polymer molecular chain and supramolecular structure in the DFB structure is adjusted by the confinement effect of the nano space of the DFB structure.

2. The conjugation length of the polymer molecular chain in the DFB structure is adjusted by the pressure applied during the fabrication of the DFB structure.

3. The formation of long-range ordered structures of the polymer molecular chains and the increase of the conjugation length (long-range orientation order of the molecular chains and supramolecular structures) increase the number and lifetime of singlet excitons generated by optical pumping, and enhance the external luminescence quantum efficiency, thereby achieving a continuous-wave pumped organic polymer laser, which is more suitable for miniaturization and weight reduction of organic polymer lasers.

4. The polymer molecular chain and the supramolecular structure are orientated to have long-range order, such that the output laser of the organic polymer laser has polarization performance.

5. The continuous-wave pumped organic polymer laser has an extremely low optical pumping threshold, which reduces the energy consumption during the use of organic polymer lasers.

6. The characteristic dimension of the distributed feedback structure is adjusted without changing the DFB structure, and the orientation order and degree of orientation of the polymer molecular chain and the supramolecular structure in the DFB structure are adjusted by virtue of the confinement effect of the nano space of the DFB structure. Thus, continuous-wave pumped organic polymer lasers with adjustable laser performance are achieved, which are more suitable for the miniaturization and weight reduction of organic polymer lasers.

The above description is only a summary of the technical solutions of the present invention. To make the technical means of the present invention clearer and implementable in accordance with the disclosure of the specification, the preferred embodiments of the present invention will be described in detail with reference to the accompanying drawings.

REFERENCE NUMERALS

1—transparent substrate without DFB structure; 2—organic polymer film; 3—template with DFB structure; 4—organic polymer with fixed shape; 5—substrate with DFB structure; and 6—plate without DFB structure.

DETAILED DESCRIPTION OF THE PREFERRED EMBODIMENTS

The invention will be further illustrated in more detail with reference to the accompanying drawings and embodiments. It is noted that, the following embodiments only are intended for purposes of illustration, but are not intended to limit the scope of the present invention.

Figure 1:
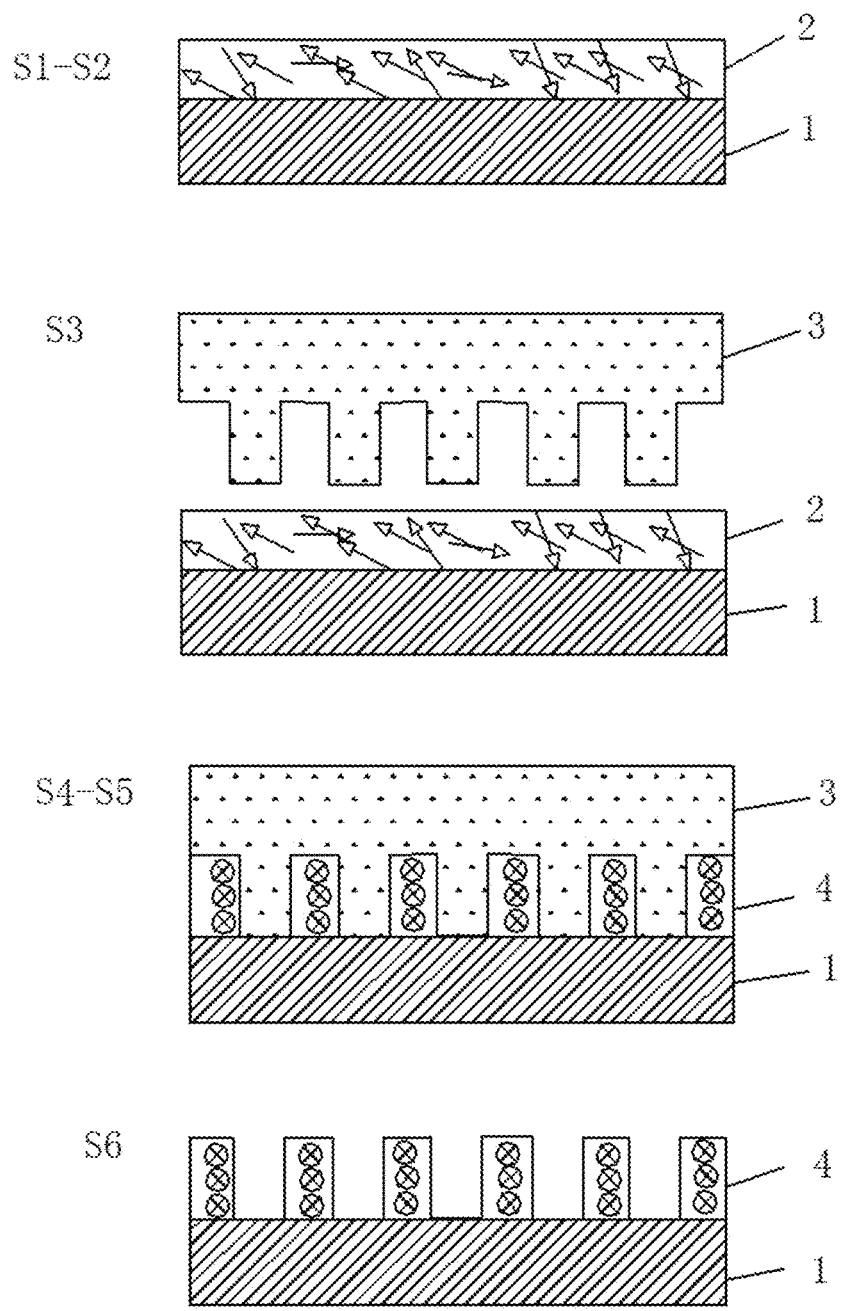
FIG. 1 is a schematic view showing a preparation process of a direct nanoimprint method of the present invention.

In order to achieve a continuous-wave pumped organic optical laser of organic polymer laser, the technical solution adopted by the present invention provides methods for preparing an organic polymer DFB structure. Specifically, referring to FIG. 1, one of the preparation methods of the present invention is direct nanoimprinting, which includes the following steps:

S1. dissolving an organic polymer in an organic solvent, to prepare an organic polymer solution with a concentration of 1.0-100 mg/ml;

S2. coating the organic polymer solution onto a transparent substrate without DFB structure 1, to form an organic polymer film 2 having an uniform thickness of 1-1000 nm;

S3. positioning the transparent substrate without DFB structure 1 on a hot stage with the organic polymer film 2 facing upward, and positioning a template with DFB structure 3 on the surface of the organic polymer film 2, such that the surface of the template with DFB structure 3 is in contact with the surface of the organic polymer, and heating the hot stage to a temperature above the phase transition temperature of the organic polymer;

S4. after the temperature of the hot stage reaches the set temperature above, applying a pressure to the template with DFB structure 3, the organic polymer film 2, and the transparent substrate without DFB structure 1, where the pressure is 1-100 atm, and the application time of pressure is 1-100 min;

S5. cooling the hot stage until the temperature of the hot stage drops to below the phase transition temperature of the organic polymer, to form an organic polymer 4 with fixed shape; and S6. peeling the template with DFB structure 3 off from the surface of the organic polymer, to obtain a continuous-wave pumped polymer laser.

Figure 2:
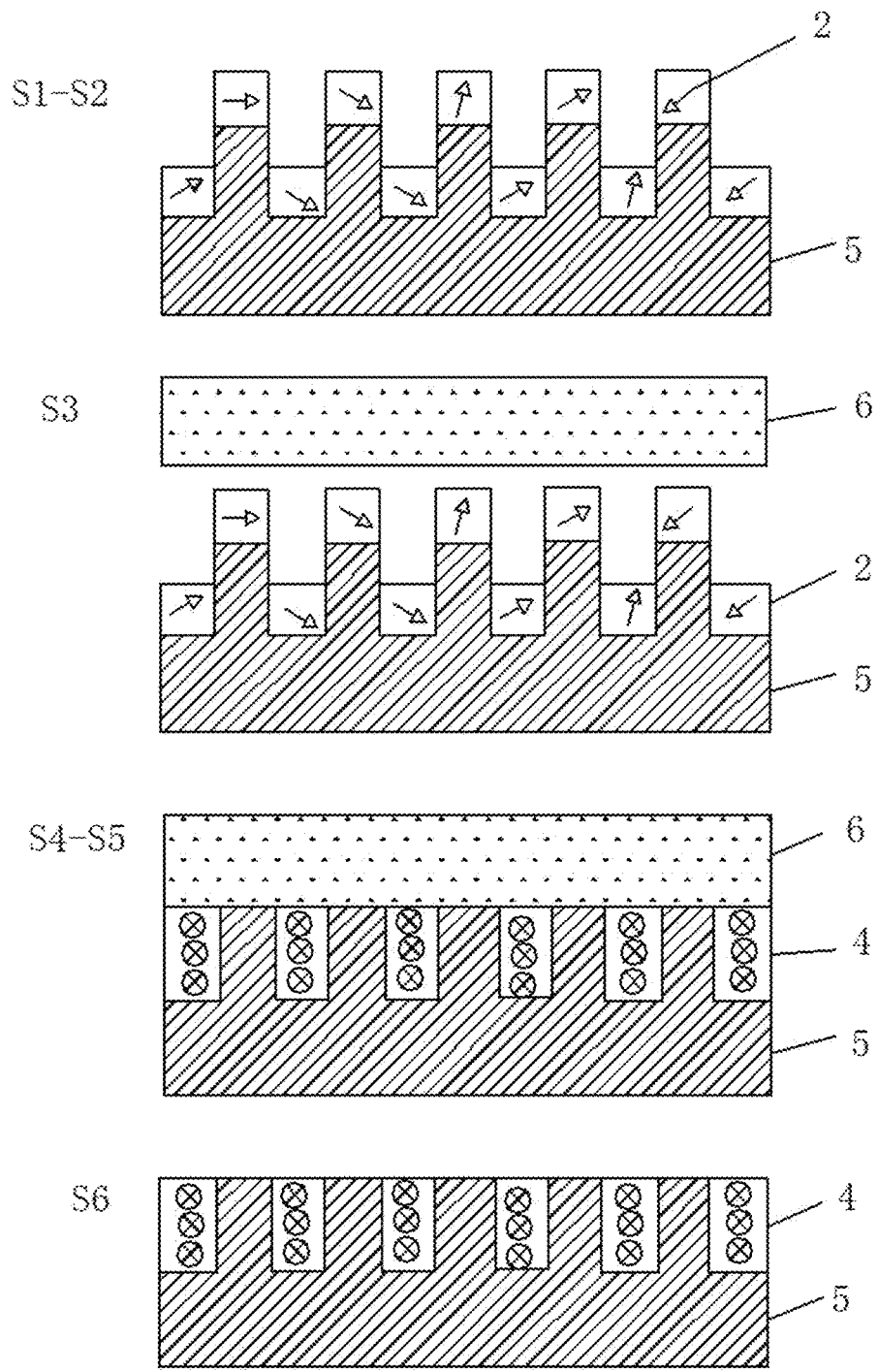
FIG. 2 is a schematic view showing a preparation process of a reverse nanoimprint method of the present invention.

Specifically, referring to FIG. 2, the preparation method of the present invention can also be a reverse nanoimprint method, which includes the following steps:

S1. dissolving an organic polymer in an organic solvent, to prepare an organic polymer solution with a concentration of 1.0-100 mg/ml;

S2. coating the organic polymer solution onto a substrate with DFB structure 5, to form a film having a thickness that is close to the height of the DFB structure;

S3. positioning the substrate with DFB structure 5 on a hot stage with the organic polymer film 2 facing upward, positioning a plate with DFB structure 6 on the surface of the organic polymer film 2, and heating the hot stage to a temperature above the phase transition temperature of the organic polymer;

S4. after the temperature of the hot stage reaches the set temperature above, applying a pressure to the system, where the pressure is 1-100 atm, and the application time of pressure is 1-100 min;

S5. cooling the hot stage until the temperature of the hot stage drops to below the phase transition temperature of the organic polymer, to form an organic polymer 4 with fixed shape; and S6. peeling the plate without DFB structure 6 off from the surface of the organic polymer to obtain a continuous-wave pumped polymer laser, wherein the organic polymer is left in and on the surface of the substrate with DFB structure 5.

The technical solution of the present invention is illustrated in combination with the following specific examples.

Example 1

Figure 3:
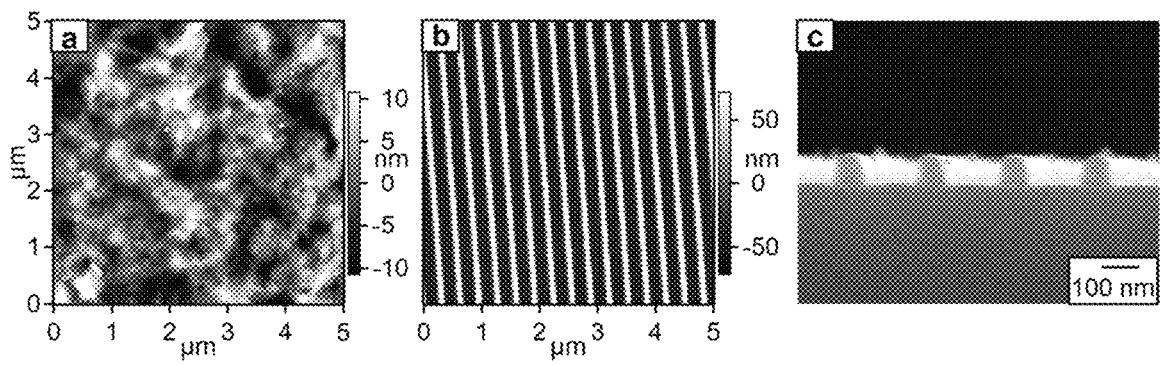
FIG. 3 shows the morphology test results by atomic force microscopy of a F8BT film in Example 1 of the present invention.

Poly(9,9-dioctyl-alt-1-4benzo{2,1'3-thiadiazole}) (F8BT) with an emission wavelength in the green region was taken as an example, the characteristic dimension of a nanoimprinting template (where the period of the DFB structure in the nanoimprinting template is 320 nm) was designed according to the Bragg diffraction equation and the emission wavelength of the organic luminescent polymer. A Bragg grating DFB structure with a width of 85 nm, a height of about 200 nm and a period of 320 nm was constructed by direct nanoimprinting. A film with a thickness of about 75 nm was obtained on a quartz substrate by spin coating, where the spin coating was carried out for 1 min at a spin speed of 5000 rpm, with a 20 mg/ml solution of F8BT in toluene). Then, the substrate with the spin-coated film was placed in a nanoimprinting machine, and covered with a nanoimprint template (planar silicon template). The temperature of the nanoimprinting system was raised to 180° C., a pressure of 60 bars was applied for 30 min. The nanoimprinting system was slowly cooled to room temperature, the pressure was removed, and the template was removed to obtain a high-fidelity F8BT Bragg grating DFB structure, which is a continuous-wave pumped polymer laser. The morphology by atomic force microscopy of the F8BT film obtained by spin coating is shown in FIG. 3a. The morphology by atomic force microscopy and cross-sectional scanning electron microscopy of the F8BT Bragg DFB structure are shown in FIGS. 3b and 3c, respectively. It can be seen that F8BT completely replicates the DFB Bragg grating structure in the nanoimprint template.

In order to confirm its orientation order, the following methods were used for test.

Figure 4:
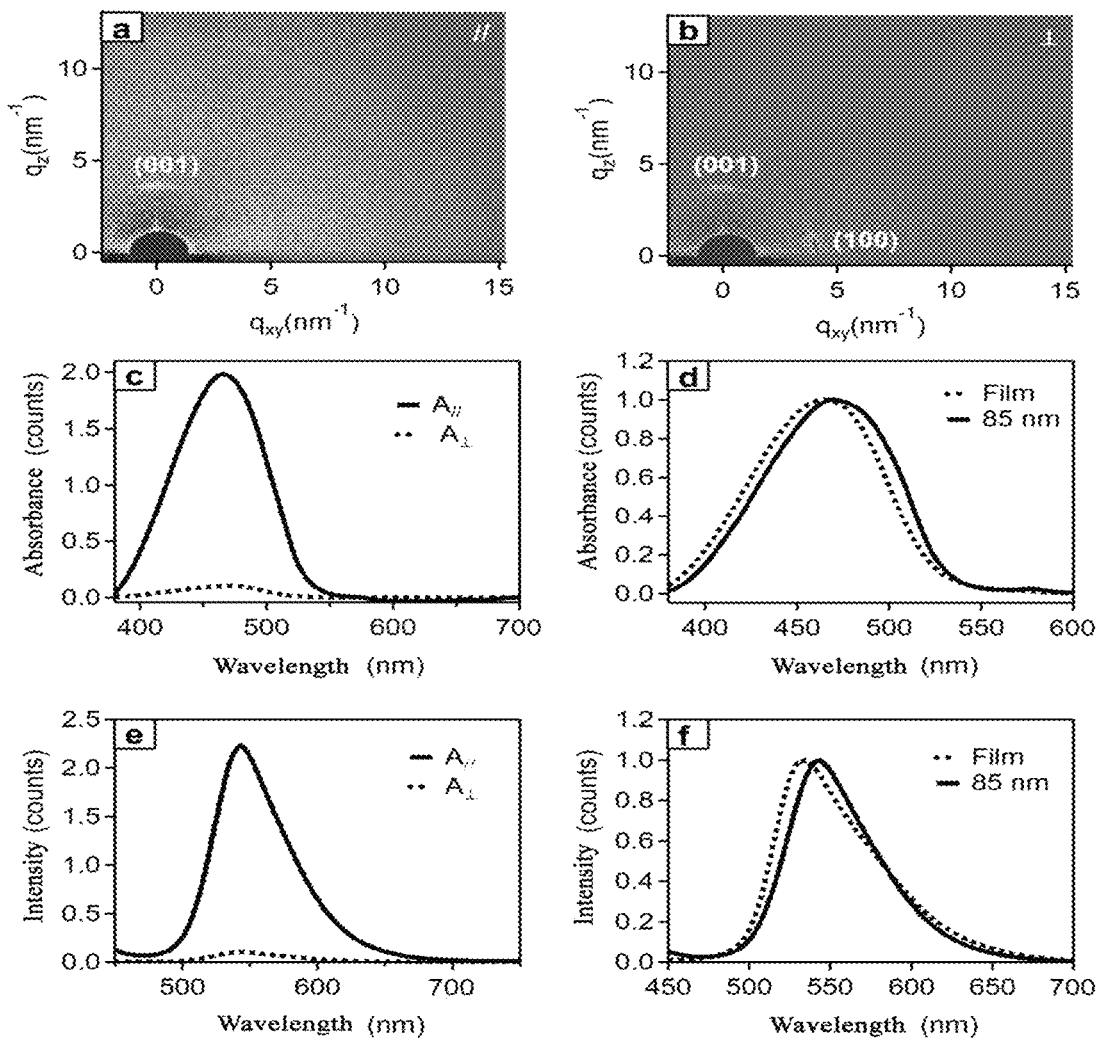
FIG. 4 shows the test results by XRD and polarized ultraviolet absorption spectrometry of the F8BT film in Example 1 of the present invention.

The molecular chain and crystal orientation in the F8BT Bragg grating obtained by the above method are analyzed by the wide-angle grazing incident X-ray diffractometer from Shanghai Synchrotron Radiation Facility. As shown in FIGS. 4a and 4b, the incident direction of the X-ray is parallel to the longitudinal direction of the F8BT nanostrip in FIG. 4a, and the incident direction of the X-ray is perpendicular to the longitudinal direction of the F8BT nanostrip in FIG. 4b. A direction perpendicular to the film substrate is defined as the $q_z$ diffraction plane, and a direction parallel to the film substrate is defined as the $q_{xy}$ diffraction plane. In both FIGS. 4a and 4b, a diffraction peak at $q_z$=3.75 nm$^{-1}$(d=1.67 nm) appears in the $q_z$ direction, which corresponds to the (001) diffraction plane of the F8BT crystal structure, indicating that the π-π stacking direction of the luminescent polymer F8BT in the nanostrip is aligned perpendicular to the film substrate. In addition, when the incident direction of the X-ray is perpendicular to the longitudinal direction of the nanostrip, the $q_{xy}$=4.23 nm$^{-1}$ (d=1.48 nm) corresponding to the (100) diffraction plane of the F8BT crystal cell appears in the $q_{xy}$ diffraction plane; and when the incident direction of the X-ray is parallel to the longitudinal direction of the nanostrip, no such a diffraction peak appears, indicating that the direction of the backbone of the F8BT molecule is aligned along the longitudinal direction of the nanostructure. The molecular backbone orientation of F8BT nanostructure arrays can be quantitatively characterized by polarized ultraviolet absorption spectroscopy and polarized fluorescence spectroscopy. FIG. 4c is a polarized ultraviolet absorption spectrum of an organic semiconductor light-emitting polymer (F8BT) nanostrip. It can be clearly seen from the figure that the absorption intensity along the longitudinal direction of the nanostrip is significantly higher than that along the vertical direction, further indicating that the molecular backbone of F8BT is aligned along the longitudinal direction of the nanostrip. The degree of orientation of the molecular backbone of the luminescent polymer F8BT is quantitatively calculated to be 0.85 according to the formula $D=(A_\parallel-A_\perp)/(A_\parallel+2A_\perp)$. FIG. 4d shows the UV absorption spectrum of the F8BT film and nanostrip. It can be seen from the figure that the UV absorption peak of the nanostrip is red shifted by 2 nm than the UV absorption peak of the film. For the luminescence spectrum, it can be seen that the luminescence intensity along the longitudinal direction of the nanostrip is significantly higher than that along the vertical direction, as shown in FIG. 4e, thereby further demonstrating that the molecular backbone direction of the F8BT is aligned along the longitudinal direction of the nanostructure array. Moreover, FIG. 4f shows the fluorescence spectrum of the organic semiconductor light-emitting polymer (F8BT) film and nanostrip. It can be seen from the figure that the emission peak of the nanostrip is red shifted by 3 nm than the emission peak of the film. The red shift of the UV absorption spectrum and the fluorescence spectrum further indicates that the conjugation length of F8BT in the nanostrip is significantly longer than that in the film.

In this example, the regulation on the lifetime and luminescence quantum efficiency of singlet excitons in the orderly oriented F8BT DFB structure is tested. The specific results are as follows.

Figure 5:
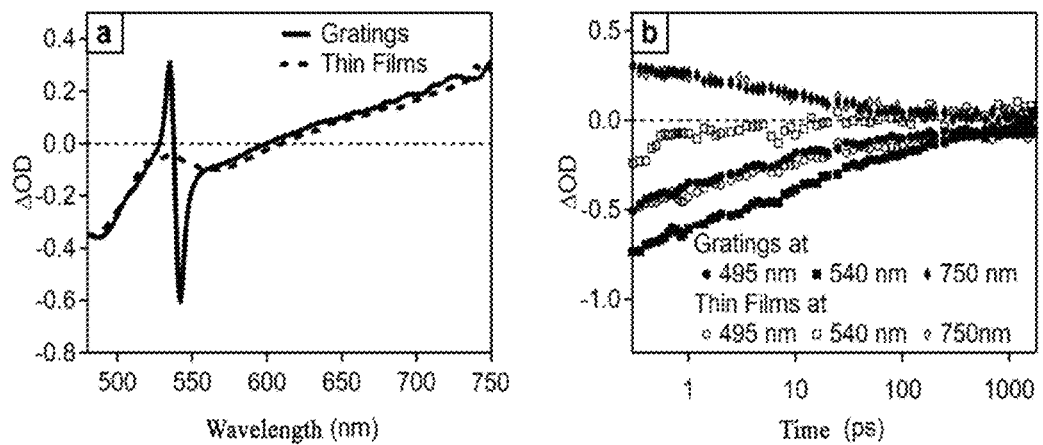
FIG. 5 shows the test results by transient absorption spectrometry of the F8BT film in Example 1 of the present invention.

The transient absorption spectrum of the orderly oriented F8BT Bragg grating is studied, as shown in FIG. 5. It can be seen that for the disordered F8BT thin film, the transient absorption spectrum is basically consistent with the report in literatures. In FIG. 5a, the ΔOD signals at 470 nm and 570 nm correspond to Photobleaching and stimulated emission of radiation respectively, and the signal at a wavelength greater than 620 nm is originated from polarons or triplet excitons. Compared with the disordered film, the photobleaching peak of the F8BT Bragg gratings are red-shifted, which is basically consistent with the spectral red shift phenomenon found in the above ultraviolet absorption spectrum and fluorescence emission spectrum. At the same time, the signal of stimulated emission of radiation of F8BT is significantly narrower (with a full width at half maximum of 7 nm), and the intensity is significantly enhanced. On one hand, this shows that amplified stimulated emission of radiation occurs in the F8BT Bragg grating, and the number of singlet excitons in the F8BT Bragg grating is significantly increased on the other hand. In FIG. 5b (where the curve consisting of open circles represents the F8BT Bragg grating and the solid curve represents the disordered F8BT film), the lifetimes of photobleaching, polarons or triplet excitons and singlet excitons are compared. As can be seen, in case that the lifetime of photobleaching, the polarons or triplet excitons remains basically unchanged, the lifetime of singlet excitons in the F8BT Bragg grating is significantly increased due to the molecular and crystal orientation of F8BT. Compared with the case in the film, the lifetime can be extended by two orders of magnitude, reaching the nanosecond magnitude of the lifetime of the polaron or triplet exciton.

Figure 6:
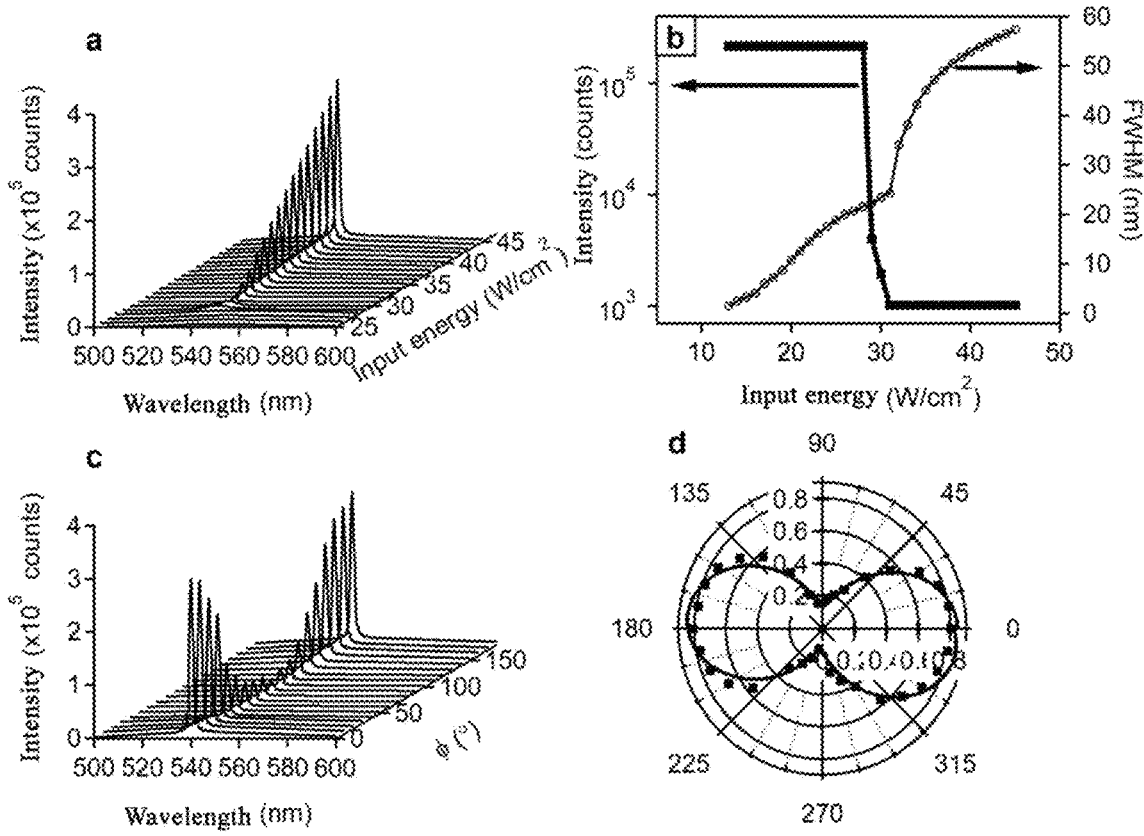
FIG. 6 shows the laser performance test results of the F8BT film in Example 1 of the present invention.

In order to test the continuous-wave pumping performance of the above F8BT DFB structure, a small semiconductor laser that outputs laser as continuous light was used as a pumping light source, and the performance of the continuous-wave pumped F8BT organic polymer laser was studied by using a fiber optic spectrometer, as shown in FIG. 6. FIG. 6a shows the emission spectrum of the F8BT organic polymer laser at various energy densities of pump light. It can be seen from the figure that when the energy density of the pump light is less than 28 W/cm$^2$, the light output from the F8BT organic polymer laser is stimulated emission of radiation. The full width at half maximum of the output light is 52 nm. When the energy density of the pump light is greater than 28 W/cm$^2$ but less than 31 W/cm$^2$, the intensity of the light output from the F8BT organic polymer laser increases sharply, and the full width at half maximum of the output light is narrowed to about 7 nm. When the energy density of the pump light is greater than 31 W/cm$^2$, the intensity of the light output from the F8BT organic polymer laser further increases sharply, and the spectral width of the output light is 1.7 nm. The full width at half maximum of the emission spectrum of the output light is gradually reduced from 52 nm to 7 nm. When the pump energy is higher than 31 W/cm$^2$, the emission spectrum is narrowed to 1.7 nm. FIG. 6b shows the intensity and spectral full width at half maximum of the light output from the F8BT organic polymer laser as a function of the energy density of the pump source. The three-stage variation indicates that the light output from the F8BT organic polymer laser is laser when pumped by continuous light and the optical pumping threshold is 31 W/cm$^2$.

In addition, the light output from the F8BT organic polymer laser has a distinct linear polarization characteristic. When the polarization direction of the analyzer is parallel to the direction of the F8BT Bragg grating, the intensity of the output light is the largest. When the polarization direction of the analyzer is perpendicular to the direction of the F8BT Bragg grating, the intensity of the output light is the lowest. The degree of polarization can reach 0.85. When the polarization direction of the analyzer is at an angle to the direction of the F8BT Bragg grating, the intensity of the output light can be modulated (FIG. 6c, d).

According to this example, a film is formed on a transparent substrate by coating (for example, spin coating, spray coating, and blade coating), and a template with DFB structure is pressed into the organic polymer film under pressure. During the process, the organic polymer is heated to above the glass transition temperature, or the melting temperature or the ordered-disorder transition temperature of the liquid crystal.

The above experimental results show that the organic polymer DFB structure with orderly oriented molecular chain and crystal constructed by this method shows anisotropy or dichroism in the information of aggregation structure of the organic polymer obtained by a scattering method or by spectroscopy.

The organic polymer DFB structure with increased molecular conjugation length constructed by this method has red shifted peak position in the absorption spectrum or luminescence spectrum of the organic polymer DFB structure, compared with the film or solution.

The continuous-wave pumped organic optical laser achieved by this method not only utilizes continuous light pumping, but also outputs continuous light. In addition, the light output from the organic polymer laser prepared by the method also has polarization characteristics.

Figure 7:
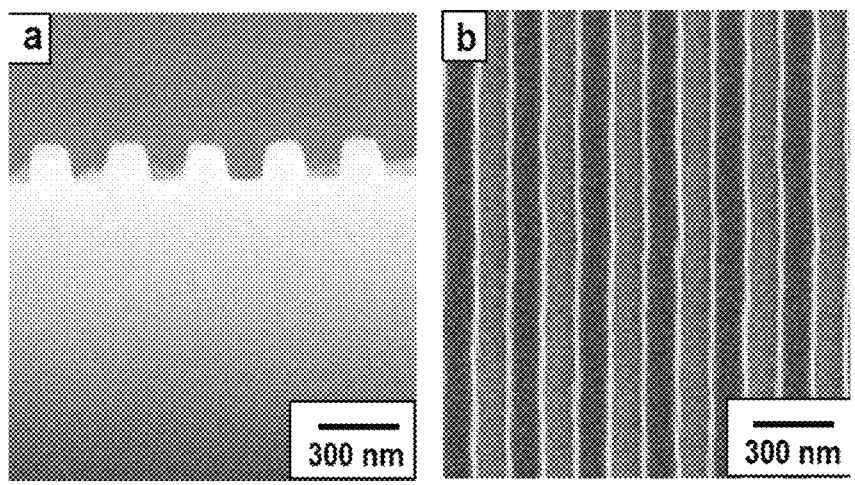
FIG. 7 shows the morphology test results by scanning electron microscopy of a PFO film in Example 2 of the present invention.

Example 2 poly(9,9-dioctylfluorene) (PFO) with an emission wavelength in the blue region was taken as an example, the characteristic dimension of a nanoimprinting template (where the period of the DFB structure in the nanoimprinting template is 280 nm) was designed according to the Bragg diffraction equation and the emission wavelength of the organic luminescent polymer. A Bragg grating DFB structure with a width of 100 nm, a height of about 200 nm and a period of 280 nm was constructed by direct nanoimprinting. A film with a thickness of about 75 nm was obtained on a quartz substrate by spin coating, where the spin coating was carried out for 1 min at a spin speed of 4000 rpm, with a 15 mg/ml solution of PFO in toluene). Then, the substrate with the spin-coated film was placed in a nanoimprinting machine, and covered with a nanoimprint template (planar silicon template). The temperature of the nanoimprinting system was raised to 180° C., a pressure of 60 bars was applied for 5 min. The nanoimprinting system was slowly cooled to room temperature, the pressure was removed, and the template was removed to obtain a high-fidelity PFO Bragg grating DFB structure, which is a continuous-wave pumped polymer laser. The scanning electron micrographs of the cross-section and surface of the PFO Bragg DFB structure are shown in FIGS. 7a and 7b, respectively. It can be seen that PFO completely replicates the DFB Bragg grating structure in the nanoimprint template.

In order to confirm its orientation order, the following methods were used for test.

Figure 8:
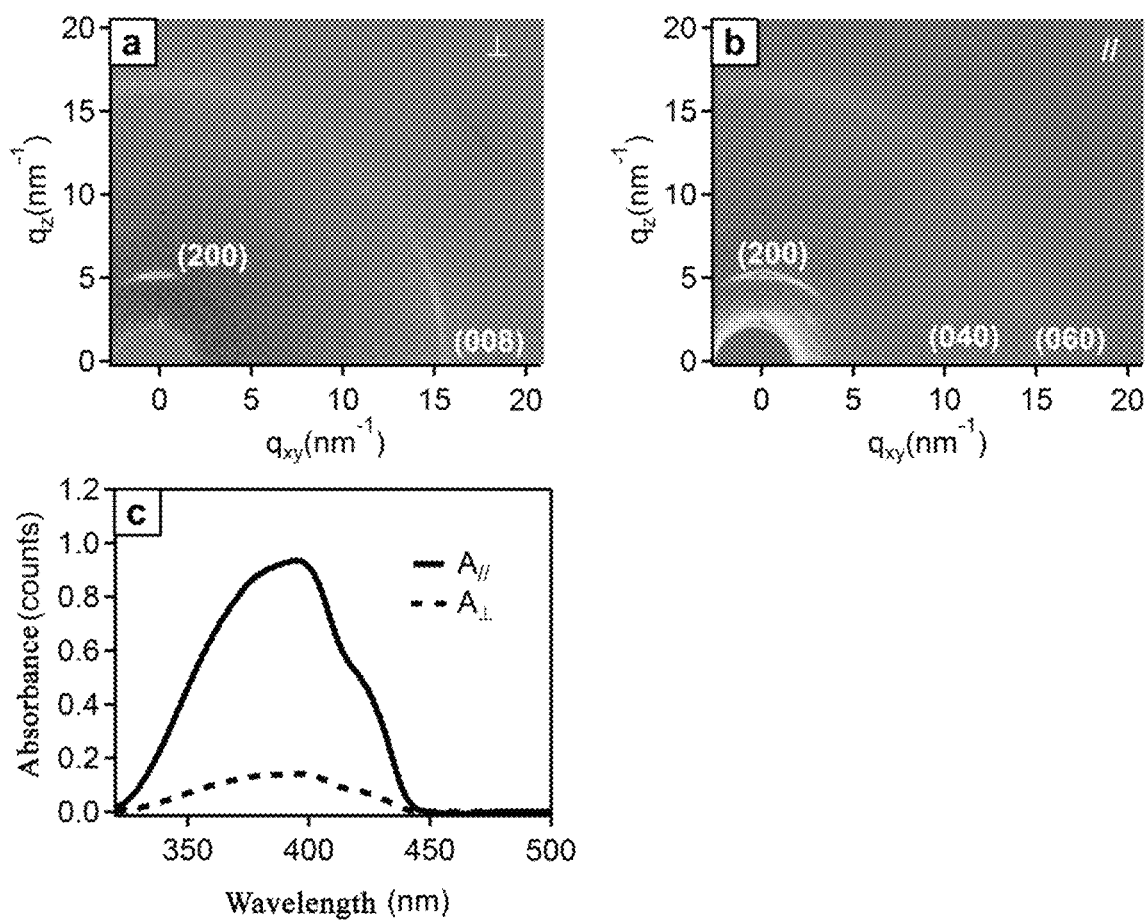
FIG. 8 shows the test results by XRD and polarized ultraviolet absorption spectrometry of the PFO film in Example 2 of the present invention.

The molecular chain and crystal orientation in the PFO Bragg grating obtained by the above method are analyzed by the wide-angle grazing incident X-ray diffractometer from Shanghai Synchrotron Radiation Facility. As shown in FIGS. 8a and 8b, the incident direction of the X-ray is parallel to the longitudinal direction of the PFO nanostrip in FIG. 8a, and the incident direction of the X-ray is perpendicular to the longitudinal direction of the PFO nanostrip in FIG. 8b. A direction perpendicular to the film substrate is defined as the $q_z$ diffraction plane, and a direction parallel to the film substrate is defined as the $q_{xy}$ diffraction plane. In FIG. 8b, a diffraction peak at $q_z$=4.91 nm$^{-1}$ (d=1.28 nm) corresponds to the (200) diffraction plane of the PFO crystal structure, indicating that the direction of the α axis of the luminescent polymer PFO crystal in the nanostrip is aligned perpendicular to the film substrate. Moreover, a diffraction peak appears at $q_{xy}$=15.14 nm$^{-1}$(d=0.42 nm) in the $q_{xy}$ diffraction plane, which corresponds to the (008) diffraction plane of the PFO crystal cells. This result indicates that the backbone direction of the PFO molecules is aligned parallel to the grating direction in the PFO DFB structure. When the incident direction of the X-ray is parallel to the longitudinal direction of the PFO nanostrip (FIG. 8b), the diffraction peak at $q_z$=4.91 nm$^{-1}$ (d=1.28 nm) can still be observed, and diffraction peaks at $q_{xy}$=10.74 nm$^{-1}$ (d=0.58 nm) and $q_{xy}$=16.11 nm$^{-1}$ (d=0.39 nm) are also found in the plane, which correspond to the (040) and (060) diffraction planes of the PFO crystal structure, respectively, this indicates that the direction of the b-axis of the PFO crystal is perpendicular to the longitudinal direction of the nanostrip. The molecular backbone orientation of PFO nanostructure arrays can be quantitatively characterized by polarized ultraviolet absorption spectroscopy and polarized fluorescence spectroscopy. FIG. 8c is a polarized ultraviolet absorption spectrum of an organic semiconductor light-emitting polymer (PFO) nanostrip. It can be clearly seen from the figure that the absorption intensity along the longitudinal direction of the nanostrip is significantly higher than that along the vertical direction, this further indicates that the molecular backbone of PFO is aligned along the longitudinal direction of the nanostrip. The degree of orientation of the molecular backbone of the organic semiconductor luminescent polymer PFO is quantitatively calculated to be 0.65 according to the formula $D=(A_\parallel - A_\perp)/(A_\parallel + 2A_\perp)$.

Figure 9:
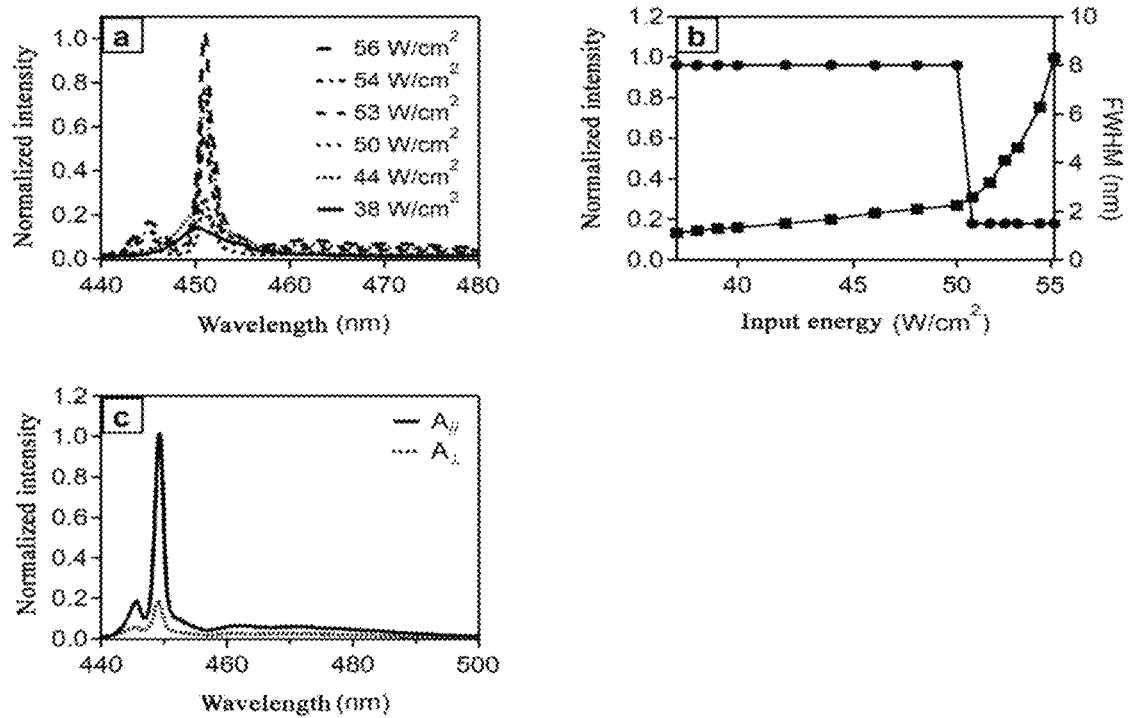
FIG. 9 shows the laser performance test results of the PFO film in Example 2 of the present invention.
Figure 10:
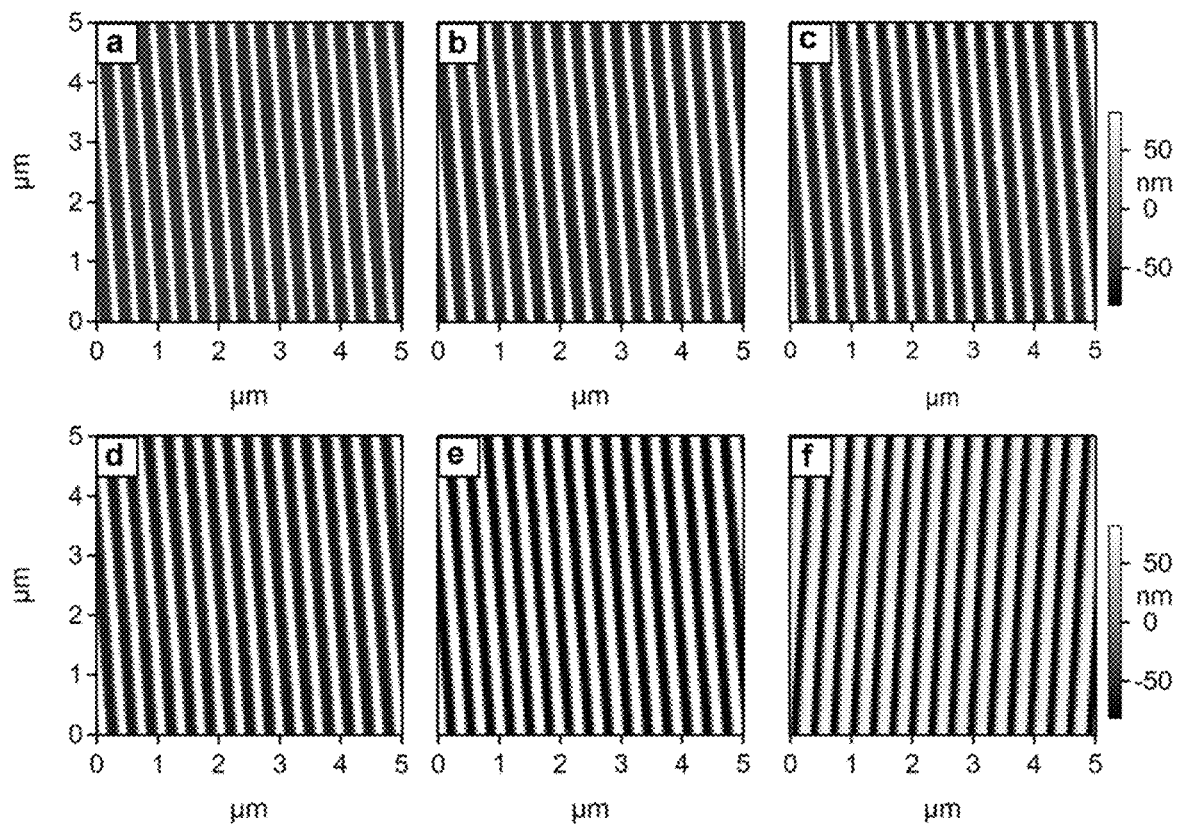
FIG. 10 shows the morphology test results by atomic force microscopy of a F8BT film prepared by changing size of DFB structure in Example 3 of the present invention.

In order to test the continuous-wave pumping performance of the above PFO Bragg DFB grating, a small semiconductor laser that outputs laser as continuous light is used as a pumping light source, and the performance of the continuous-wave pumped PFO organic polymer laser is studied by using a fiber optic spectrometer, as shown in FIG. 9. FIG. 9a shows the emission spectrum of the PFO organic polymer laser at various energy densities of pump light. It can be seen from the figure that when the energy density of the pump light is less than 50 W/cm$^2$, the light output from the PFO organic polymer laser is stimulated emission of radiation. The full width at half maximum of the output light is 8 nm. When the energy density of the pump light is greater than 50 W/cm$^2$, the intensity of the light output from the PFO organic polymer laser further increases sharply, the full width at half maximum of the output light is narrowed, and the spectral width of the output light is 1.5 nm. FIG. 9b shows the intensity and spectral full width at half maximum of the light output from the PFO organic polymer laser as a function of the energy density of the pump source. The two-stage variation indicates that the light output from the PFO organic polymer laser is laser when pumped by continuous light and the optical pumping threshold is 48 W/cm$^2$.

In addition, the light output from the PFO organic polymer laser has a distinct linear polarization characteristic, as shown in FIG. 9c. When the polarization direction of the analyzer is parallel to the direction of the PFO Bragg grating, the intensity of the output light is the largest. When the polarization direction of the analyzer is perpendicular to the direction of the PFO Bragg grating, the intensity of the output light is the lowest. The degree of polarization can reach 0.60.

The above experimental results show that the organic polymer DFB structure with orderly oriented molecular chain and crystal constructed by the method of the present invention shows anisotropy or dichroism in the information of aggregation structure of the organic polymer obtained by a scattering method or by spectroscopy.

The continuous-wave pumped organic optical laser achieved by this method not only utilizes continuous light pumping, but also outputs continuous light. In addition, the light output from the organic polymer laser prepared by the method also has polarization characteristics.

Example 3 poly(9,9-dioctyl-alt-1-4benzo{2,1'3-thiadiazole}) (F8BT) with an emission wavelength in the green region was take as an example, the characteristic dimension of a nanoimprinting template (where the period in the nanoimprinting template is 320 nm) is designed according to the Bragg diffraction equation and the emission wavelength of the organic luminescent polymer. Bragg grating DFB structures with a width of 85 nm, 95 nm, 110 nm, 135 nm, 180 nm, and 200 nm respectively, a height of about 200 nm and a period of 320 nm were constructed by direct nanoimprinting. For the specific method, refer to Example 1. A high fidelity F8BT Bragg grating DFB structure can be obtained. as shown in FIG. 10, FIGS. 10a-f show the results of the F8BT Bragg FB structures having a width of 85 nm, 95 nm, 110 nm, 135 nm, 180 nm, and 200 nm respectively (where in each case, the period is 320 nm).

Figure 11:
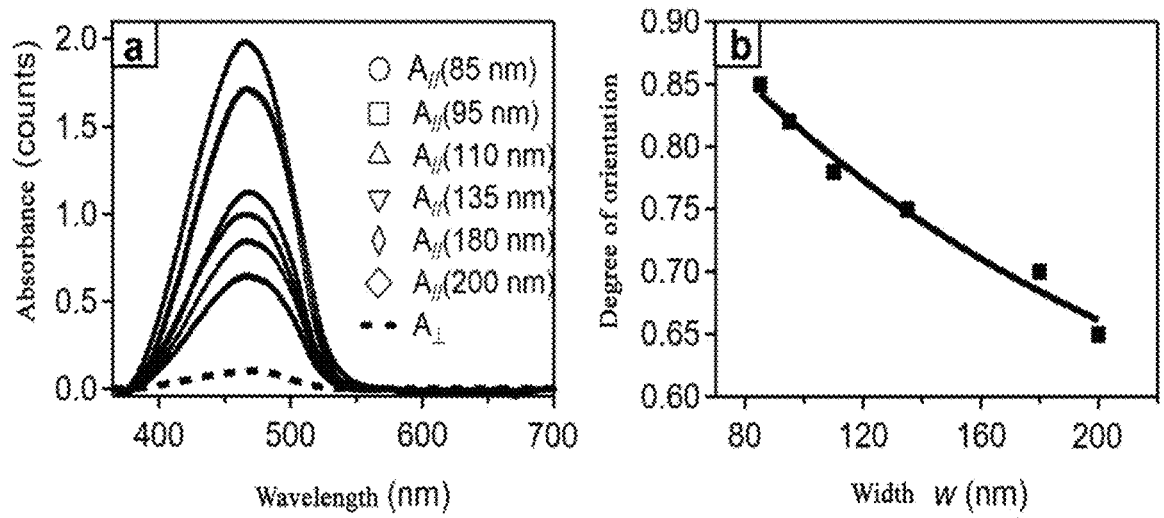
FIG. 11 shows the test results by polarized ultraviolet absorption spectrometry of the F8BT film prepared by changing size of DFB structure in Example 3 of the present invention.

The molecular backbone orientation of F8BT nanostructure arrays can be quantitatively characterized by polarized ultraviolet absorption spectroscopy and polarized fluorescence spectroscopy. FIG. 11a shows a polarized ultraviolet absorption spectrum of the luminescent polymer F8BT nanostrip. According to the formula $D=(A_{\parallel}-A_{\perp})/(A_{\parallel}+2A_{\perp})$ it can be quantitatively calculated that the degree of orientation of the molecular backbone of the organic semiconductor luminescent polymer (F8BT) is 0.65, 0.7, 0.75, 0.78, 0.82 and 0.85, respectively, when the width of the DFB structure is 85 nm, 95 nm, 110 nm, 135 nm, 180 nm, and 200 nm, respectively. FIG. 11b shows the degree of orientation of the backbone of the F8BT molecule as a function of the width. As the width increases, the degree of orientation of the backbone of the F8BT molecule gradually decreases.

The regulation on the lifetime and luminescence quantum efficiency of singlet excitons in various orderly oriented F8BT DFB structures prepared in this example is tested. The specific results are as follows.

Figure 12:
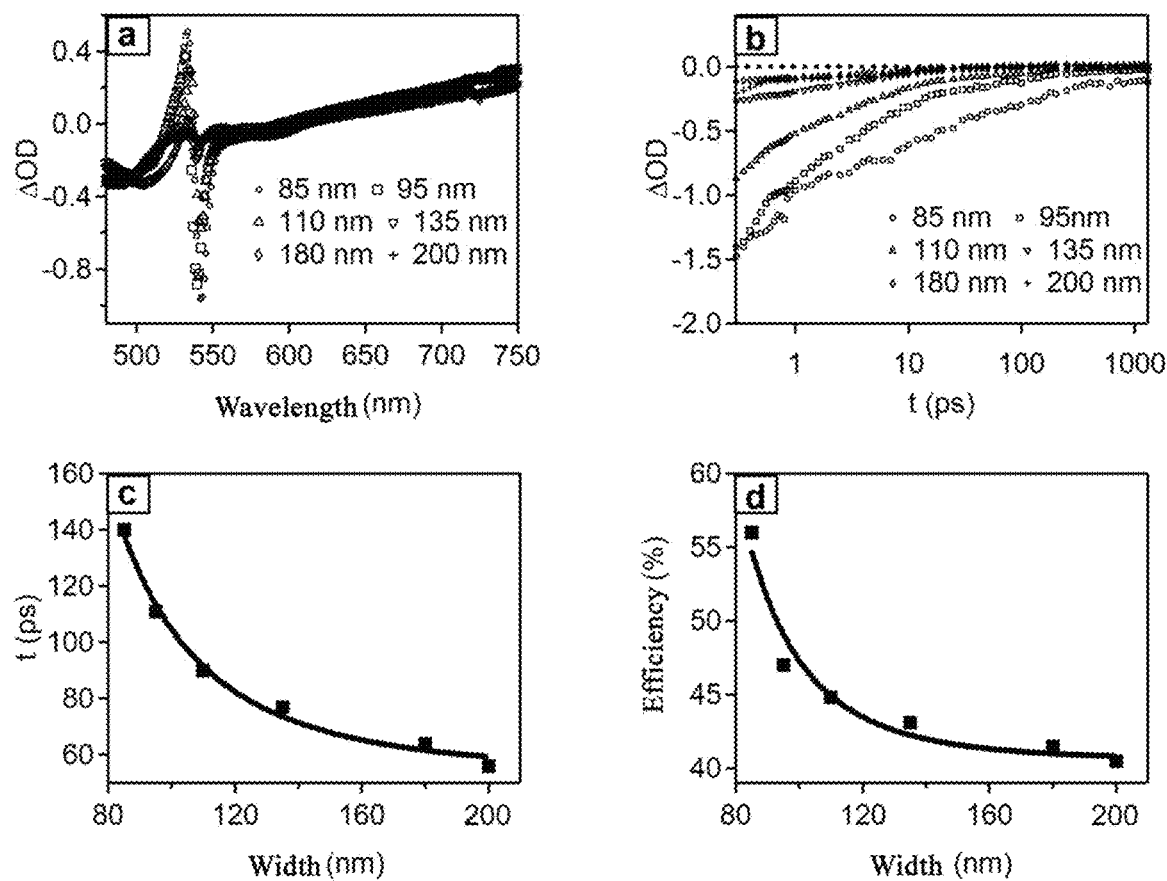
FIG. 12 shows the test results by transient absorption spectrometry of the F8BT film prepared by changing size of DFB structure in Example 3 of the present invention.

The transient absorption spectrum of the orderly oriented F8BT Bragg grating is studied, as shown in FIG. 12. In FIG. 12a, the ΔOD signals at 470 nm and 570 nm correspond to Photobleaching and stimulated emission of radiation respectively, and the signal at a wavelength greater than 620 nm is originated from polarons or triplet excitons. In the F8BT Bragg structures with different widths, the signal of stimulated emission of radiation of F8BT is significantly narrower (with a full width at half maximum of 7 nm), and the intensity is gradually enhanced. On one hand, this shows that amplified stimulated emission of radiation occurs in the F8BT Bragg grating, and the number of singlet excitons in the F8BT Bragg grating is significantly increased with the decreasing width of the structure on the other hand. In FIG. 12a, the lifetimes of photobleaching, polarons or triplet excitons and singlet excitons are compared, and the statistical results are shown in FIG. 12c. As can be seen, in case that the lifetime of photobleaching, the polarons or triplet excitons remains basically unchanged, the lifetime of singlet excitons in the F8BT Bragg grating is significantly increased with the decreasing width of the structure due to the molecular and crystal orientation of F8BT, reaching the nanosecond magnitude of the lifetime of the polaron or triplet exciton. The lifetime of singlet excitons gradually decreases as the width of the nanostrip increases. As shown in FIG. 12d, the luminescence efficiency of the singlet excitons is characterized. As the width of the nanostrip increases, the luminescence efficiency of the singlet excitons decreases gradually.

Figure 13:
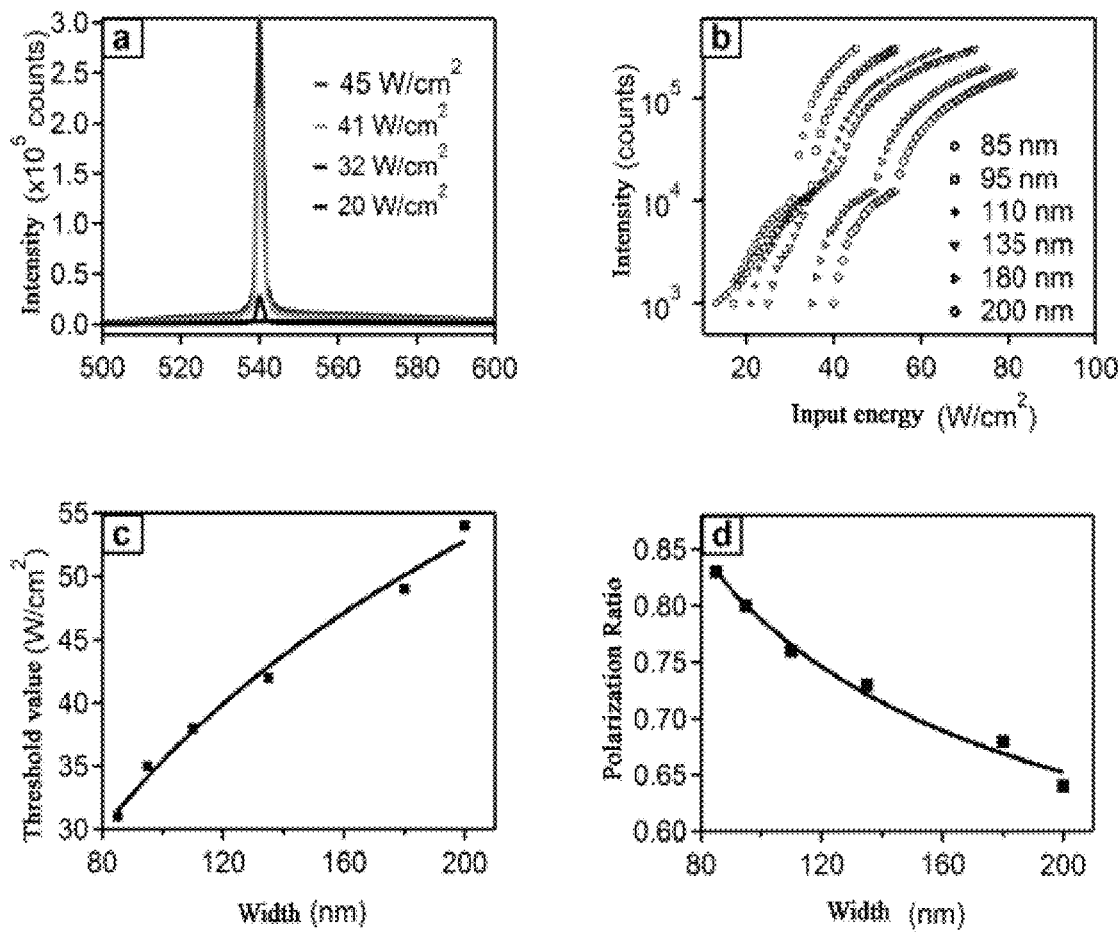
FIG. 13 shows the laser performance test results of the F8BT film prepared by changing size of DFB structure in Example 3 of the present invention.

In order to test the continuous-wave pumping performance of the above F8BT DFB structure, a small semiconductor laser that outputs laser as continuous light was used as a pumping light source, and the performances of the continuous-wave pumped F8BT organic polymer lasers having the same period, but different sizes of DFB structure were studied by using a fiber optic spectrometer. A small semiconductor laser that outputs laser as continuous light is used as a pumping light source, and the performance of the continuous-wave pumped F8BT organic polymer laser was studied by using a fiber optic spectrometer, as shown in FIG. 13. FIG. 13a shows the emission spectrum of the F8BT organic polymer laser at various energy densities of pump light. It can be seen from the figure that when the energy density of the pump light is less than 28 W/cm$^2$, the light output from the F8BT organic polymer laser is stimulated emission of radiation. The full width at half maximum of the output light is 52 nm. When the energy density of the pump light is greater than 28 W/cm$^2$ but less than 31 W/cm$^2$, the intensity of the light output from the F8BT organic polymer laser increases sharply, and the full width at half maximum of the output light is narrowed to about 7 nm. When the energy density of the pump light is greater than 31 W/cm$^2$, the intensity of the light output from the F8BT organic polymer laser further increases sharply, and the spectral width of the output light is 1.7 nm. The full width at half maximum of the emission spectrum of the output light is gradually reduced from 52 nm to 7 nm. When the pump energy is higher than 31 W/cm$^2$, the emission spectrum is narrowed to 1.7 nm. FIG. 13b shows the intensity and spectral full width at half maximum of the light output from the F8BT organic polymer laser at various widths as a function of the energy density of the pump light source. The three-stage variation indicates that the light output from the F8BT organic polymer laser is laser when pumped by continuous light and the optical pumping threshold is 31 W/cm$^2$. Furthermore, by statistical calculation of the threshold (FIG. 13c), it can be found that the threshold gradually increases as the width increases.

In addition, the light output from the F8BT organic polymer laser has a distinct linear polarization characteristic. When the polarization direction of the analyzer is parallel to the direction of the F8BT Bragg grating, the intensity of the output light is the largest. When the polarization direction of the analyzer is perpendicular to the direction of the F8BT Bragg grating, the intensity of the output light is the lowest. The degree of polarization can reach 0.85, and the degree of polarization gradually decreases as the characteristic dimension of the Bragg grating increases. In summary, the laser performance (threshold, degree of polarization) can be successfully modulated by modulating the characteristic dimension of the Bragg grating.

Example 4

Figure 14:
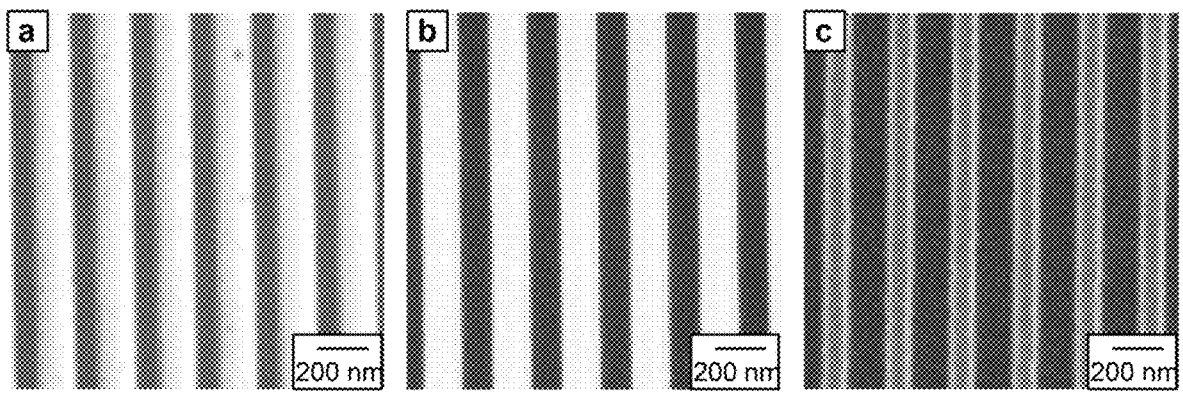
FIG. 14 shows the morphology test results by scanning electron microscopy of a PFO film prepared by changing size of DFB structure in Example 4 of the present invention.

Poly(9,9-dioctylfluorene) (PFO) with an emission wavelength in the blue region was taken as an example, the characteristic dimension of a nanoimprinting template (where the period in the nanoimprinting template is 280 nm, and the width is 100 nm, 140 nm, and 160 nm respectively) was designed according the Bragg diffraction equation and the emission wavelength of the organic luminescent polymer. Bragg grating DFB structures with a width of 100 nm, 140 nm, and 160 nm, a height of about 100 nm and a period of 280 nm were constructed by direct nanoimprinting. For the specific method, refer to Example 2. A continuous-wave pumped polymer laser can be obtained. FIG. 14 is a scanning electron micrograph of the PFO DFB grating in which the width of the nanostrip in the DFB structure is 100 nm (FIG. 4a), 140 nm (FIG. 4b) and 160 nm (FIG. 4c), and the period is 280 nm.

Figure 15:
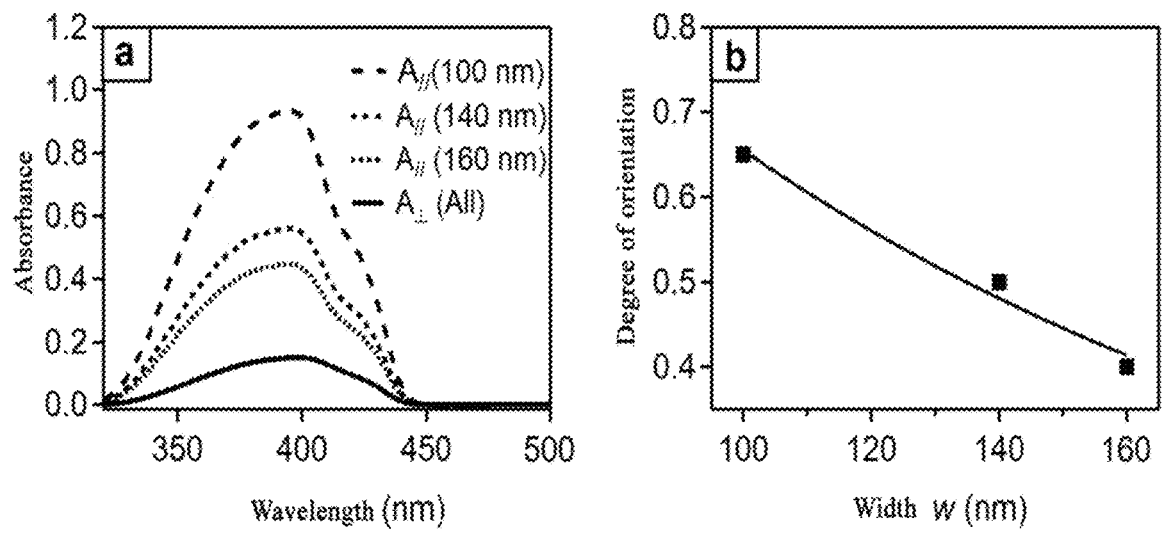
FIG. 15 shows the test results by polarized ultraviolet absorption spectrometry of the PFO film prepared by changing size of DFB structure in Example 4 of the present invention.

The molecular backbone orientation of PFO nanostructure arrays can be quantitatively characterized by polarized ultraviolet absorption spectroscopy. FIG. 15a is a polarized ultraviolet absorption spectrum of an organic semiconductor light-emitting polymer (PFO) nanostrip. It can be clearly seen from the figure that the absorption intensity along the longitudinal direction of the nanostrip is significantly higher than that along the vertical direction, this further indicates that the molecular backbone of PFO is aligned along the longitudinal direction of the nanostrip. The degree of orientation of the molecular backbone of the organic semiconductor luminescent polymer F8BT is quantitatively calculated to be 0.65, 0.5, and 0.4 according to the formula $D=(A_{\parallel}-A_{\perp})/(A_{\parallel}+2A_{\perp})$ (FIG. 15b).

Figure 16:
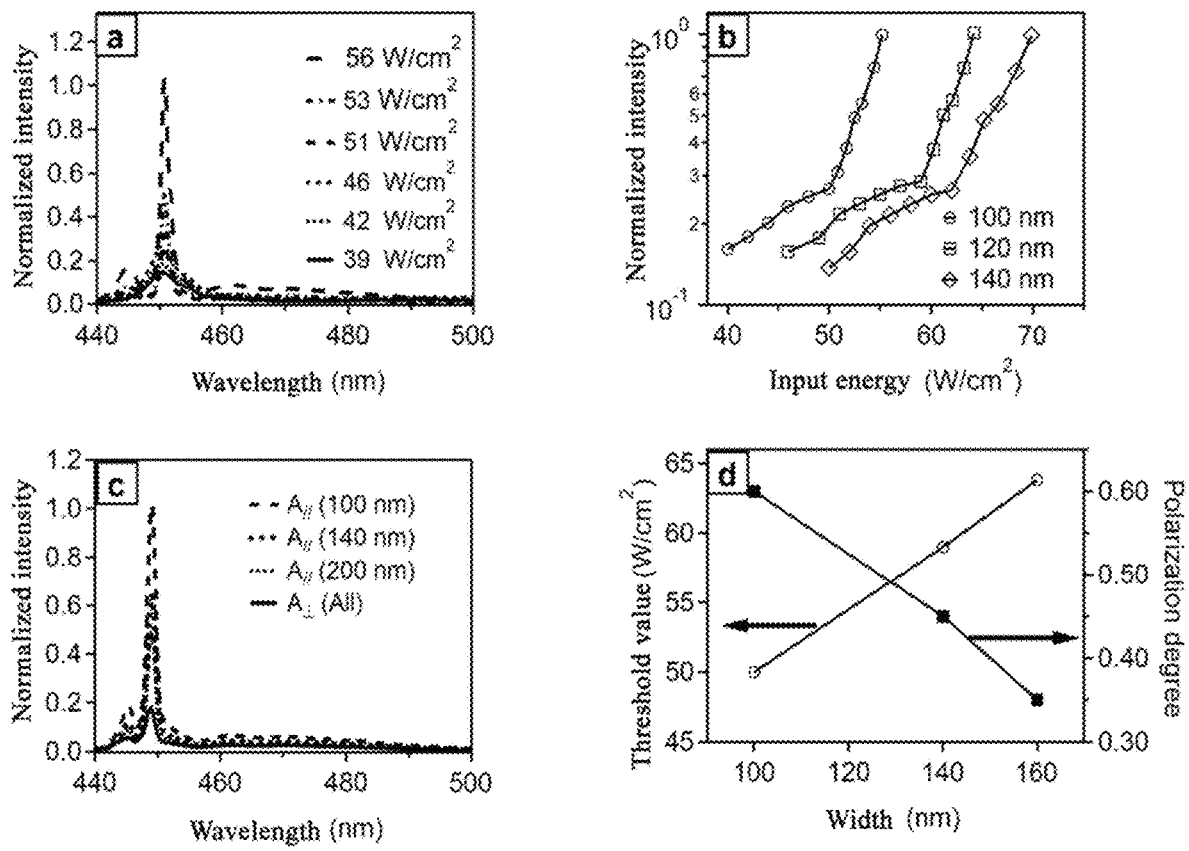
FIG. 16 shows the laser performance test results of the PFO film prepared by changing size of DFB structure in Example 4 of the present invention.

In order to test the continuous-wave pumping performance of the above PFO DFB structure, a small semiconductor laser that outputs laser as continuous light is used as a pumping source, and the performance of the continuous-wave pumped PFO organic polymer laser is studied by using a fiber optic spectrometer, as shown in FIG. 16. FIG. 16a shows the emission spectrum of the PFO organic polymer laser at various pump energy densities. It can be seen from the figure that when the energy density of the pump light is less than 48 W/cm$^2$, the light output from the PFO organic polymer laser is stimulated emission of radiation. The full width at half maximum of the output light is 18 nm. When the energy density of the pump light is greater than 48 W/cm$^2$, the intensity of the light output from the PFO organic polymer laser further increases sharply, the full width at half maximum of the output light is narrowed, and the spectral width of the output light is 2 nm. FIG. 16b shows the intensity and spectral full width at half maximum of the light output from the PFO organic polymer laser as a function of the energy density of the pump source. The three-stage variation indicates that the light output from the PFO organic polymer laser is laser when pumped by continuous light and the optical pumping threshold is 48 W/cm$^2$. Furthermore, by statistical calculation of the threshold (FIG. 16d), it can be found that the threshold gradually increases as the width increases.

In addition, the light output from the PFO organic polymer laser has a distinct linear polarization characteristic, as shown in FIG. 16c. When the polarization direction of the analyzer is parallel to the direction of the PFO Bragg grating, the intensity of the output light is the largest. When the polarization direction of the analyzer is perpendicular to the direction of the PFO Bragg grating, the intensity of the output light is the lowest. The degree of polarization can reach 0.65, and the degree of polarization gradually decreases as the characteristic dimension of the Bragg grating increases (as shown in FIG. 16d). In summary, the laser performance (threshold, degree of polarization) can be successfully modulated by modulating the characteristic dimension of the Bragg grating.

The above experimental results show that the organic polymer DFB structure with orderly oriented molecular chain and crystal constructed by the method of the present invention shows anisotropy or dichroism in the information of aggregation structure of the organic polymer obtained by a scattering method or by spectroscopy, and the orientation order of the molecules and crystals can be regulated by the DFB structures with the same period, but different sizes.

By using the DFB structures with the same period, but different sizes constructed by this method, the degree of long-range order of the polymer molecules and crystals decreases as the width increases.

The laser performance of the continuous-wave pumped organic polymer laser achieved by the method can be adjusted by the characteristic dimension of the DFB structure.

The above description is only preferred embodiments of the present invention and not intended to limit the present invention, it should be noted that those of ordinary skill in the art can further make various modifications and variations without departing from the technical principles of the present invention, and these modifications and variations also should be considered to be within the scope of protection of the present invention.

What is claimed is:

1. A method for preparing a continuous-wave pumped polymer laser, comprising steps of:
    (1) coating an organic solution of an organic polymer onto a planar transparent substrate, to form an organic polymer film, and applying a template having a distributed feedback structure to the surface of the organic polymer film, or
    coating an organic solution of an organic polymer onto a transparent substrate having a distributed feedback structure, to form an organic polymer film, and applying a plate to the surface of the polymer film,
    wherein the organic polymer is a photoluminescence polymer;
    (2) heating the substrate to allow the temperature of the substrate to be above the phase transition temperature of the organic polymer, and then applying a pressure to the surface of the template or plate for 1-100 min; and
    (3) slowly cooling the substrate to allow the temperature of the substrate to be below the phase transition temperature of the organic polymer, and removing the template or plate from the surface of the organic polymer, to obtain the continuous-wave pumped polymer laser.

2. The method for preparing a continuous-wave pumped polymer laser according to claim 1, wherein in the step (1), the substrate is made of silicon, silica, alumina, quartz, glass, polyamides, polyesters, polyvinylidene fluoride, polytetrafluoroethylene, or polysiloxane.

3. The method for preparing a continuous-wave pumped polymer laser according to claim 1, wherein in the step (1), the organic polymer is a polyfluorene homopolymer having an emission wavelength of 400-480 nm, wherein the polyfluorene homopolymer is poly(9,9-dioctylfluorene) and/or poly(9,9-diethylhexylfluorene).

4. The method for preparing a continuous-wave pumped polymer laser according to claim 1, wherein in the step (1), the organic polymer is a polyfluorene copolymer having an emission wavelength of 480-580 nm, wherein the polyfluorene copolymer is selected from the group consisting of poly(9,9-dioctylfluorene-alt-6,6'-pyridine), poly(9,9-dioctylfluorene-alt-6,6'-2,2'-bipyridine), poly(9,9-dioctylfluorene-alt-6,6'-2,2':6'2''-terpyridine), and poly(9,9-dioctyl-alt-1-4-benzo(2,1'3-thiadiazole).

5. The method for preparing a continuous-wave pumped polymer laser according to claim 1, wherein in the step (1), the organic polymer is a poly(phenylenevinylene) polymer having an emission wavelength of 580-700 nm, wherein the poly(phenylenevinylene) polymer is selected from the group consisting of poly[2-methoxy-5-(2-ethylhexyloxy)1,4-phenylenevinylene], poly[2-methoxy-5-(3,7-dimethyloctyloxy)1,4-phenylenevinylene], and poly[2-methoxy-5-(3,7-dimethyloctyloxy)-1,4-phenylacetylene].

6. The method for preparing a continuous-wave pumped polymer laser according to claim 1, wherein in the step (1), the period of the distributed feedback structure matches with the emission wavelength of the organic polymer to satisfy the Bragg condition, that is $2\eta_{eff}\Lambda=2\lambda_{Bragg}$, where $\eta_{eff}$ is the refractive index of the organic polymer, $\Lambda$ is the period of the distributed feedback structure, and $\lambda_{Bragg}$ is the emission wavelength of the organic polymer.

7. The method for preparing a continuous-wave pumped polymer laser according to claim 1, wherein in the steps (2) and (3), the phase transition temperature is glass transition temperature, crystallization temperature, or order-disorder transition temperature of the liquid crystal.

8. The method for preparing a continuous-wave pumped polymer laser according to claim 1, wherein in the step (2), the applied pressure is 1-100 atm.

9. The method for preparing a continuous-wave pumped polymer laser according to claim 1, wherein in the step (4), after removing the template or plate, the method further comprises the step of coating the surface of the organic polymer with a transparent protective layer, where the protective layer is made of silicon oxide, calcium oxide, polysiloxane, polyethylene terephthalate, polyethylene naphthalate, polyamide or polytetrafluoroethylene.

10. A continuous-wave pumped polymer laser prepared by the method according claim 1, comprising a transparent substrate and an organic polymer having orientation order on the transparent substrate, wherein the organic polymer is a photoluminescence polymer and has a distributed feedback structure.

* * * * *